(12) United States Patent
Aguren (10) Patent No.: US 9,225,539 B2
(45) Date of Patent: Dec. 29, 2015

(54) STORING DATA RELATING TO CABLES

(75) Inventor: Jerry G Aguren, Tomball, TX (US)

(73) Assignee: Hewlett Packard Enterprise Development LP, Houston, TX (US)

(*) Notice: Subject to any disclaimer, the term of this patent is extended or adjusted under 35 U.S.C. 154(b) by 643 days.

(21) Appl. No.: 13/259,967

(22) PCT Filed: Jan. 15, 2010

(86) PCT No.: PCT/US2010/021220
§ 371 (c)(1),
(2), (4) Date: Nov. 29, 2011

(87) PCT Pub. No.: WO2011/087509
PCT Pub. Date: Jul. 21, 2011

(65) Prior Publication Data
US 2012/0063501 A1 Mar. 15, 2012

(51) Int. Cl.
*H04B 3/46* (2015.01)
*H04L 12/26* (2006.01)
*G01R 31/11* (2006.01)
*H04L 12/24* (2006.01)

(52) U.S. Cl.
CPC ............ *H04L 12/2697* (2013.01); *H04L 41/12* (2013.01); *H04L 43/50* (2013.01); *G01R 31/11* (2013.01); *H04L 41/0213* (2013.01)

(58) Field of Classification Search
CPC ......... H04Q 1/135; H04Q 1/138; H04Q 1/13; H04Q 1/136
See application file for complete search history.

(56) References Cited

U.S. PATENT DOCUMENTS

| | | |
|---|---|---|
| 2004/0153264 A1 | 8/2004 | Teich et al. |
| 2005/0245127 A1* | 11/2005 | Nordin et al. ............... 439/540.1 |
| 2006/0004543 A1 | 1/2006 | Vogel et al. |
| 2006/0148279 A1* | 7/2006 | German et al. ................. 439/49 |
| 2006/0182439 A1 | 8/2006 | Hernandez |
| 2006/0290356 A1 | 12/2006 | Pharn et al. |
| 2008/0100456 A1 | 5/2008 | Downie |
| 2008/0175159 A1* | 7/2008 | Caveney et al. ............. 370/248 |
| 2008/0240724 A1 | 10/2008 | Aguren |
| 2009/0055666 A1* | 2/2009 | Yee ............................... 713/320 |
| 2009/0073424 A1* | 3/2009 | Xia et al. ..................... 356/73.1 |
| 2009/0175195 A1* | 7/2009 | Macauley ..................... 370/254 |
| 2010/0026193 A1* | 2/2010 | Niedermeier ................. 315/149 |
| 2011/0153543 A1* | 6/2011 | Woodward et al. ............ 706/54 |
| 2011/0153544 A1* | 6/2011 | Nagel et al. .................... 706/54 |
| 2013/0108232 A1* | 5/2013 | Hou et al. .................... 385/135 |
| 2013/0201993 A1* | 8/2013 | Enge et al. .................... 370/401 |

OTHER PUBLICATIONS

International Search Report and Written Opinion, dated Sep. 28, 2010, 8 pages.

* cited by examiner

*Primary Examiner* — Shi K Li
*Assistant Examiner* — Mina Shalaby
(74) *Attorney, Agent, or Firm* — Hewlett Packard Enterprise Patent Department (57) ABSTRACT

A cable adapter apparatus (201) is disclosed having at least one adapter (203) and a controller (206). The adapter apparatus is operable to: determine connection of a cable test device (208) to a first port (230, 231, 232) of the at least one adapter; receive data from the test device relating to at least one tested characteristic of a cable (251, 261, 271) connected to a second port (240, 241, 242) of the at least one adapter opposite said first port; and store the received tested cable characteristic data in a memory. The stored tested cable characteristic data may be made available to a cable monitor application (225). A method including storing data resulting from processing data from a reflected signal is also disclosed. A modified reflectometer device adapted to be connected to a first port of a cable adapter is also disclosed.

20 Claims, 8 Drawing Sheets

STORING DATA RELATING TO CABLES

FIELD OF THE INVENTION

The invention relates generally to storing data relating to cables.

BACKGROUND

Networking infrastructures such as data centers house large numbers of electronic equipment, such as computers and storage devices. Such networking infrastructures can span from a single room to multiple floors of an entire building. Servers are often stacked in rack cabinets that are placed in rows forming corridors so technicians can access the rear of each cabinet. Mainframe computers and other storage devices are often placed near the servers and can occupy spaces as large as the racks themselves.

Data centers and other networking infrastructures can have enormous numbers of cable and wires connecting various electronic equipments. Even though such facilities are highly organized, the number of cables interconnecting such equipment can be overwhelming. Installing, maintaining, and tracking cables and connections to equipment can be complex. In order to effectively manage a data center or other facility with large amounts of electronic equipment, sufficient information about cables, connections, and electronic equipment is required.

SUMMARY

One example embodiment is a cable adapter apparatus that includes at least one adapter and a controller. The adapter determines connection of a cable test device to a first port of the at least one adapter and receives data from the test device relating to at least one tested characteristic of a cable connected to a second port of the at least one adapter opposite said first port. The adapter also stores the received tested cable characteristic data in a memory, and makes the stored tested cable characteristic data available to a cable monitor application.

BRIEF DESCRIPTION OF THE DRAWINGS

In order that the invention may be well understood, various embodiments thereof will now be described, by way of example only, with reference to the accompanying drawings, in which.

Drawings are schematic and not to scale.

DETAILED DESCRIPTION

At least some embodiments in accordance with the present invention are directed to apparatus, methods and devices for use in monitoring cables, for example fiber optic cables in a data center. One embodiment uses a specially modified optical time domain reflectometer (OTDR) to temporarily connect to a first port of an adapter of an optical fiber patch panel, to infer a length of a cable that is connected to an opposite port of the adapter for transmitting and receiving optical signals through the adapter. An exemplary patch panel includes a controller having a memory to store information about the patch panel's ports, and can communicate the stored data externally of the patch panel, for example over a network, using suitable protocols such as SMI-S (Storage Management Initiative-Specification) or SNMP (Simple Network Management Protocol). The embodiment stores the inferred cable length data in a memory associated with the patch panel. For example, the data is stored in a memory of an integrated circuit disposed locally of the adapter, from where it can be accessed by the patch panel controller and stored in the patch panel controller memory. The patch panel controller makes the data available to a cable monitor application on a networked host computer. The OTDR can then be removed from the first port, and an end connector of an optical fiber communication cable connected to the first port. In some embodiments, the end connector has attached thereto a memory storing cable identification and characterisation data, which data, following connection of the end connector to the first port, is stored to the memory local to the adapter and accessed by the patch panel controller and, in turn, the cable monitor application.

Figure 1:
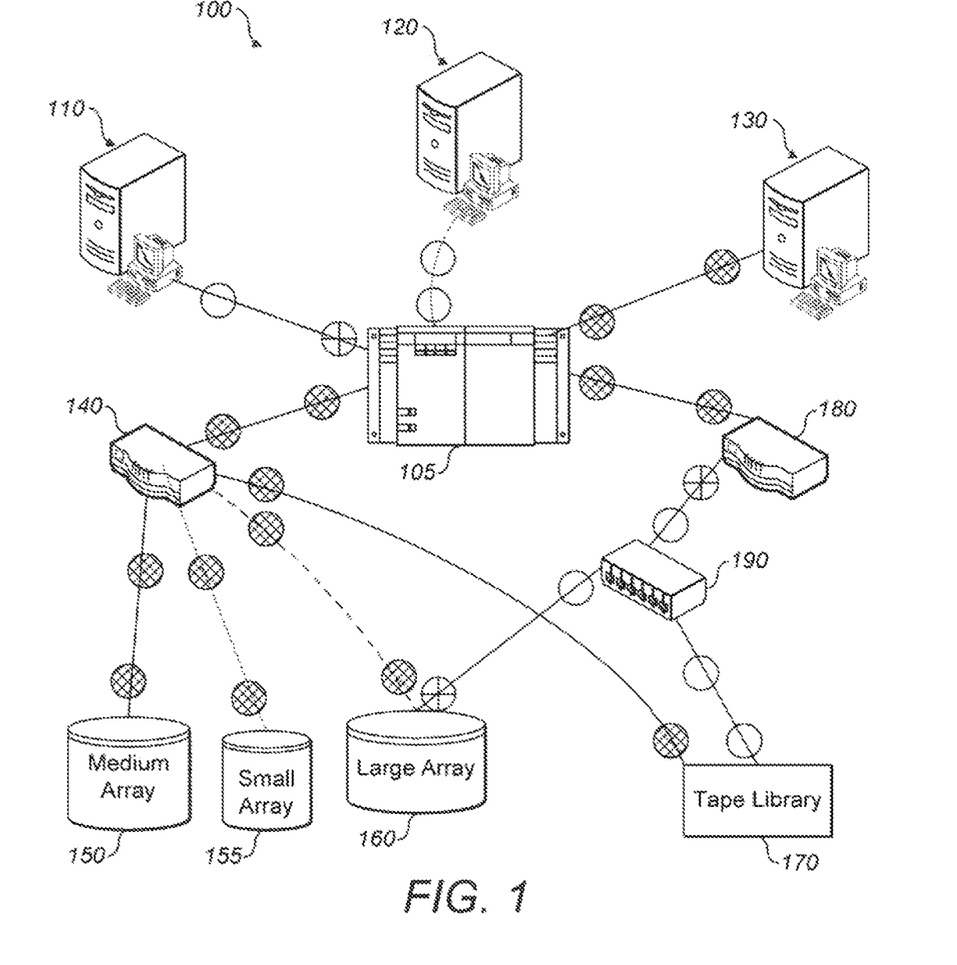
FIG. 1 shows a network with which embodiments of the invention can be used, the network including cable monitoring components.

At least some embodiments of the invention can be employed with cable monitoring system components such as those shown in FIG. 1 and described in U.S. Patent Application Publication Number U.S. 2008/0240724A1, which is incorporated herein by reference in its entirety. U.S. 2008/0240724A1 describes RFID readers embedded in a transceiver such as an SFP (Small Form-factor Pluggable), SFP+ or SFF, and small current passive RFID (Radio Frequency Identification) tags positioned in optical fiber cable end connectors, the tags providing information including a unique identifier in both connectors at each end of a cable, and detailed cable parameters such as manufacturer, length and connector type. Various applications are used to support data collection across a data center using standard protocols such as SNMP and SMI-S with data extensions to support reading SFP or RFID devices, the extensions relating to the RFID tag data in the cable and operational data from the transceiver. U.S. 2008/0240724A1 further discloses using a cable monitoring and diagnostic algorithm to calculate the operational condition of an optical fiber cable during use and determine, for example in real time status of a cable. The status can be determined using a minimal set of data acquired, for example, from an RFID reader embedded in an SFP at only one end of the cable. The status can also be determined using more information, such as a comprehensive set of system information that includes SFP and cable-embedded RFID tag data acquired at both ends of the cable.

By way of illustration, FIG. 1 includes a data center and has a director switch 105 that connects to various servers, switches, and storage devices. For example, director switch connects to server A 110, server B 120, server C 130, Fibre Channel switch A 140 (which connects to medium array 150, small array 155, and large array 160), tape library 170, Fibre Channel switch B 180, and optical patch panel 190. Various connections or communication pathways are shown with a dotted line (cable with a critical failure), dashed line (cable with degraded operation), and solid line (cable with normal operation, no faults or failures). Further, the connection status at each respective electronic device is indicated with one of an empty circle (SFP or SFF without embedded RFID tag reader or cable without RFID tag), circle with hatching (SFP or SFF with embedded RFID tag reader), and/or circle encompassing a cross (complete status of cable and/or transceiver unknown because no data is available from transceiver at the other end).

Generally, cable adapters are used for conveniently interconnecting cable ends, usually by receiving respective cable end connectors at opposite sides of the adapter. A cable adapter generally does not support a transceiver such as an SFP, thus precluding, for example, convenient use of a transceiver with embedded RFID reader at the adapter to receive cable data from a cable end. The lack of data can be exacerbated where both ends of the cable are connected to respective cable adapters, and/or for some field terminated or custom cables where cable data such as length may not have been previously collected or stored. At least some embodiments of the present invention facilitate provision, for example over a network, of cable data from cables connected, for example at both ends of the cable, to cable adapters. At least some embodiments facilitate communication of dynamic cable data from one side of a patch panel, and also of static cable characterisation data from an opposite side of the patch panel, to a cable monitor application, to facilitate improved real-time physical layer monitoring and diagnosis of a cable network. At least some embodiments of the invention can be provided without unduly increasing the cost and/or complexity of providing a cable adapter apparatus with improved cable data provision.

Figure 2:
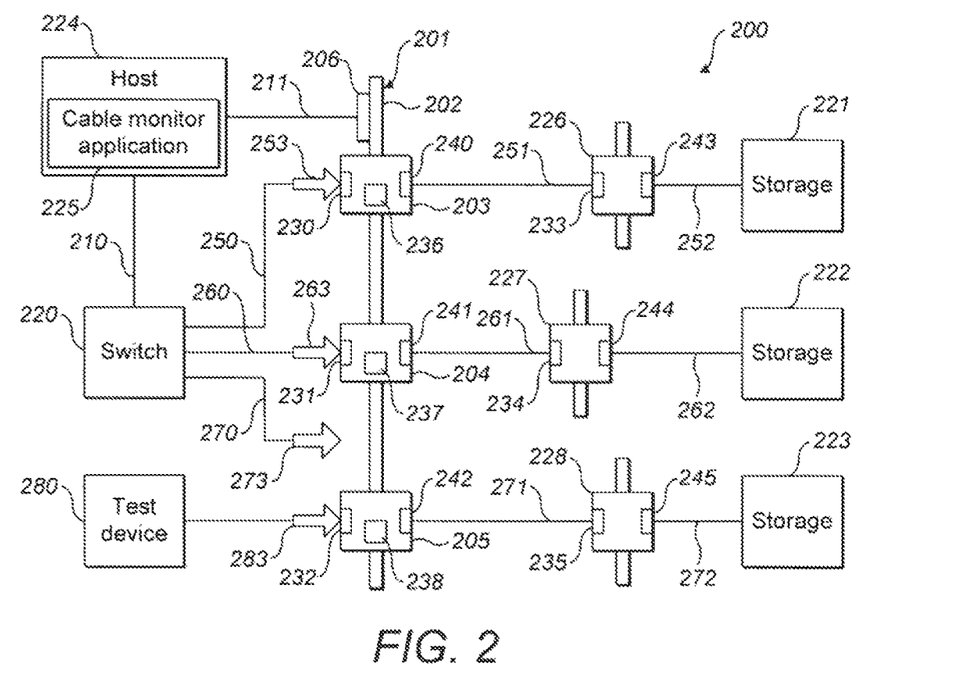
FIG. 2 shows a portion of a network including a multi-adapter cable adapter apparatus.

FIG. 2 shows a portion 200 of a network comprising a multi-adapter cable adapter apparatus in the form of a patch panel 201, the patch panel 201 comprising a body 202 supporting a plurality of cable adapters 203, 204, 205 and a controller 206. While for convenience three adapters are shown in the patch panel 201 of FIG. 2, it will be understood that any convenient number of adapters can be provided on the patch panel 201. The network portion 200 also includes a network switch 220, storage devices 221, 222, 223 such as hard disk drive arrays and/or tape libraries, a host computer 224 to execute a cable monitor application 225, and further cable adapters 226, 227, 228. The further cable adapters 226, 227, 228 can be stand-alone adapters or form part of one or more multi-adapter devices.

The patch panel adapters 203, 204, 205 comprise respective first ports 230, 231, 232 opening to a first side of the patch panel 201 and respective second ports 240, 241, 242 opening to a second side of the patch panel 201 opposite to the first side. The patch panel 210 is provided with electrical connections (510, partially shown in FIG. 5) between the controller 206 and each of the adapters 203, 204, 205, to enable a patch panel internal communication interface (410, FIG. 4) of the controller 206 to exchange electrical communications signals with the respective adapters 203, 204, 205. The patch panel 210 can also be provided with further electrical connections (511, partially shown in FIG. 5) between a power supply of the controller 206 and each of the adapters 203, 204, 205, for supplying power to the respective adapters 203, 204, 205. In some embodiments, the patch panel adapters 203, 204, 205 comprise respective integrated circuits 236, 237, 238, described in further detail below. The further adapters 226, 227, 228 also comprise respective first ports 233, 234, 235 and oppositely disposed second ports 243, 244, 245.

Switch 220 is connected to storage 221 along a route including cables 250, 251, 252. Cable 250 comprises a cable end connector 253 connected to the first port 230 of the adapter 203. The cable end connector 253 comprises an integrated circuit (IC) device (305, FIGS. 3 and 7) having a memory 721 storing data relating to the cable 250, and is described in greater detail below with respect to FIG. 3. The opposite end of the cable 250 comprises an end connector (not shown) connected to a port of the switch 220, such as an SFP port, and the SFP can for example be enhanced to read cable data stored on the end connector, for example as described in U.S. 2008/0240724A1. Cable 251 interconnects the rear port 240 of patch panel adapter 203 with port 233 of the further adapter 226. Cable 251 may be a field terminated or custom cable, and the end connectors of cable 251 do not generally store cable data. Cable 252 interconnects port 243 of adapter 226 with storage 221. At least one cable end connector (not shown) of cable 252 can comprise an integrated circuit having a memory storing data related to the cable 252. The storage 221 can comprise an SFP with embedded RFID reader, for example as described in U.S. 2008/0240724A1, for reading data relating to the cable 252 stored in the cable end connector.

One or more servers (not shown) can conveniently be connected to the network, for example to or through the switch 220. The switch 220, controller 206, and storage 221, 222, 223 are connected by respective cables (210, 211, not shown), or by any other convenient route across the network to communicate with the cable monitor application 225 on the host computer 224. Cable data and other data read at the switch 220 and storage 221 can be communicated over the network to the cable monitor application 225 using SMI-S and/or SNMP protocols extended to accommodate this type of data.

Figure 3:
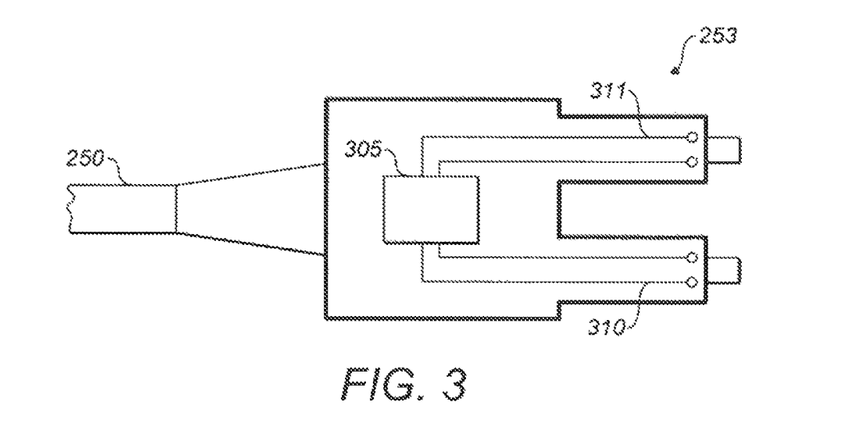
FIG. 3 is a cross sectional view showing selected elements of an end connector of a cable.

Switch 220 is connected to the storage 222, 223 along further routes respectively including cables 260, 261, 262 and 270, 271, 272. The cables along the further routes are connected as shown in FIG. 2 to the various network components analogously to the connections of the cables 250, 251, 252. Ends of the cables 260, 270 can be terminated by cable end connectors 263, 273 similar to the connector 253 (FIG. 3). In FIG. 2, cable 270 is shown disconnected from port 232 of adapter 205. A test device 280, such as an OTDR, is connected to the port 232 using a connector 283, as described in greater detail below.

Figure 4:
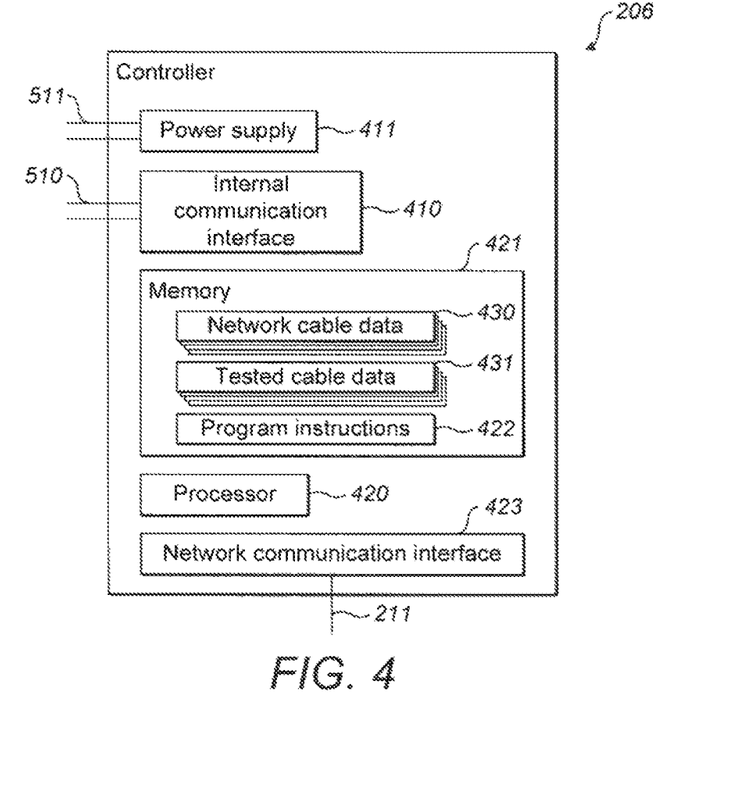
FIG. 4 is a schematic diagram illustrating selected functional elements of a controller of the multi-adapter apparatus of FIG. 2.

FIG. 4 shows further details of selected features of the controller 206 of the patch panel 201. The controller 206 comprises a processor 420 and a memory 421. The memory 421 can take the form, for example, of at least one selected from EEPROM, flash memory, RAM or any other convenient type of memory. The memory 421 stores program instructions 422 executable by the processor 420 to provide various functions of the controller 206. The controller implements an internal communication interface 410. The controller internal communication interface 410 is connected to the adapters 203, 204, 205 by the electrical connections 510, and implements a suitable inter-integrated circuit communication protocol, for example I2C or another convenient inter-integrated circuit protocol. The controller 206 also comprises a power supply 411 operable to supply power to the adapters 203, 204, 205 using the electrical connections 511. The controller 206 is operable to receive and store in memory 421 network cable data 630 relating, for example, to cables 250, 260, 270 when connected to ports 230, 231, 232. The controller 206 is also operable to receive and store in memory 421 tested cable data 631 relating, for example, to cables 251, 261, 271 when connected to ports 240, 241, 242. The controller implements a suitable protocol for receiving and storing the cable data, for example an extended protocol compliant with the SFF-8472 Specification for Diagnostic Monitoring Interface for Optical Transceivers, or any other convenient protocol. The controller 206 also comprises a network communication interface 423 implementing SMI-S and/or SNMP protocols for communicating the stored network cable data 630 and stored tested cable data 631 to the network cable monitor application 225 on the host computer 224.

Figure 5:
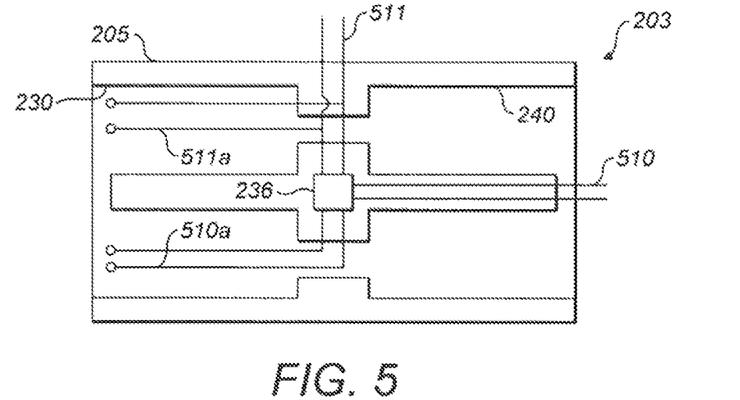
FIG. 5 is a cross sectional view showing selected elements of an adapter of the multi-adapter apparatus of FIG. 2.

FIG. 5 shows a representative one of the adapters 203 of the patch panel 201 for receiving a cable end connector, for example end connector 253 shown in FIG. 3. The adapter 203 comprises a body 205 defining first and second ports 230, 240 to receive and interconnect the ends of two respective communication cables. The ports 230, 240 in the present embodiment are configured to receive modified LC cable end connectors. In alternative embodiments each port is configured to receive any other suitable type of cable end connector. An integrated circuit (IC) device 236 (FIG. 7) is associated with the adapter 203. For example, the IC device 236 is mounted in, to or adjacent the adapter 203. The adapter 205 comprises an electrical connection 510a configured to mate with a corresponding electrical connection 310 of the cable end connector 253 when the cable end connector 253 is inserted in the port 230, to enable inter-integrated circuit communication between the IC device 305 of the cable end connector 253 and the IC device 236 of the adapter 203. In some embodiments, the adapter 203 also comprises an electrical connection 511a configured to mate with a corresponding electrical connection 311 of the cable end connector 253 when the cable end connector 253 is inserted in the port 230, to enable the IC device 305 of the cable end connector 253 to receive power from the controller 206.

Figure 6:
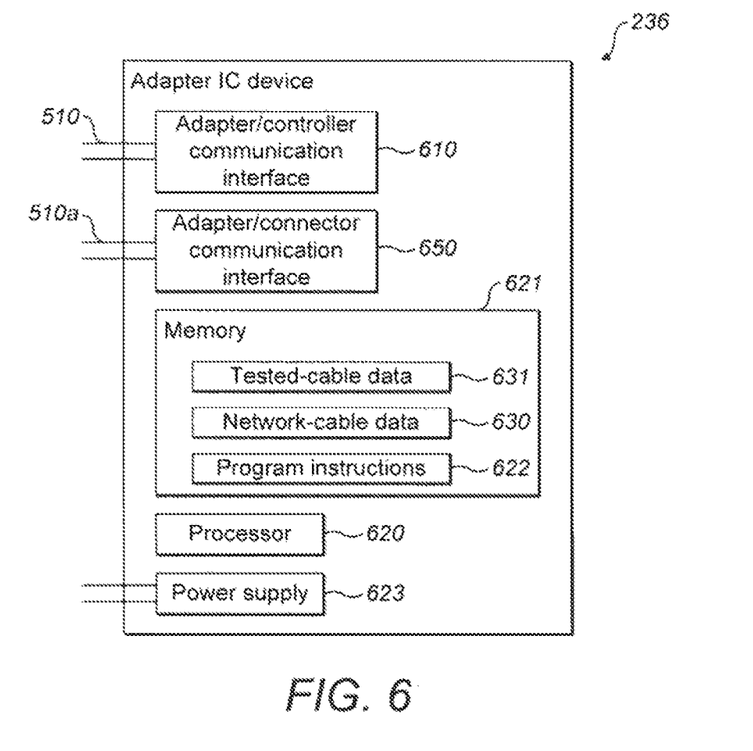
FIG. 6 is a schematic diagram illustrating selected functional elements of an integrated circuit (IC) device associated with the adapter of FIG. 5.
Figure 7:
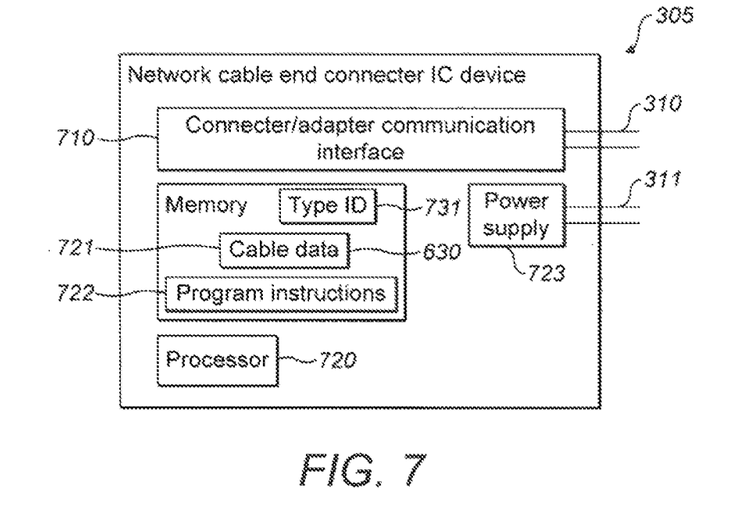
FIG. 7 is a schematic diagram illustrating selected functional elements of an integrated circuit (IC) device of the connector of FIG. 3.

FIGS. 6 and 7 respectively show the IC device 236 associated with the adapter 203 and the IC device 305 associated with the connector 253 in greater detail. The cable end connector IC device 305 is, for example, attached to the connector 253 in any convenient manner, such as by embedding the IC device 305 in a recess of the body of the IC device 305. The IC device 305 comprises a processor 720 and a memory 721. The memory 721 can take the form, for example, of EEPROM, flash memory or any other convenient type of memory. The memory 721 stores program instructions 722 executable by the processor 720 to provide various functions of the cable and connector IC device 305. The memory 721 also stores connector type identification data 731 to enable identification of a presently connected connector 253, 283 at the first port 230 as a network communication cable or as a cable test device. The IC device 305 implements a connector/adapter communication interface 710 for inter-integrated circuit communication with the adapter IC device 236 through the electrical connection 310. The IC device 305 also comprises a power supply 723 for receiving power through the adapter 203 through mating electrical connections 311 and 511a when the connector 253 is connected to the port 230 of the adapter 203. The cable end connector IC device 305 is adapted to store in the memory 721 cable data 630, using a suitable protocol, for example according to the SFF-8472 or any other convenient protocol. The cable data 720 can comprise, for example, a unique identifier or serial number of the cable, manufacturer details, connector type, cable length and other physical cable parameters, and can be programmed in memory using any convenient interface, including interface 710.

The adapter IC device 236 comprises a processor 620 and a memory 621. The memory 621 can take the form, for example, of EEPROM, flash memory or any other convenient type of memory. The memory 621 stores program instructions 622 executable by the processor 620 to provide various functions of the adapter IC device 236. The adapter IC device 236 implements an adapter/controller communication interface 610 for inter-integrated circuit communication with the internal communication interface 410 through the electrical connection 510. The adapter IC device 236 also comprises a power supply 623 for receiving power from the controller 206 through the electrical connection 511. The adapter IC device 236 further implements an adapter/connector communication interface 650 for inter-integrated circuit communication with the connector/adapter communication interface 710 of the end connector IC device 305 through mating connections 510a and 310 when the connector 253 is connected to the port 230 of the adapter 203. The adapter IC device 236 is operable to receive and store in memory 621 cable data 630 received from cable end connector IC device 305. The adapter IC device 236 is also operable to receive, from a test device 280 connected to port 230, and store in memory 621, tested-cable data relating to a cable 251 connected to port 240. The adapter IC device 236 implements a suitable protocol for receiving and storing the cable data, for example an extended protocol compliant with SFF-8472. The adapter IC device 236 is operable to receive and process connector type identification data 731, 831 from a presently connected connector 253, 283 to distinguish between a network communication cable connector 253 and a test device connector 283, and to store the received data accordingly.

The adapter IC device 236 is, for example, attached to the adapter 203 in any convenient manner, such as by embedding the IC device 236 in a recess of the body 205 of the IC device 236. Alternatively, the adapter IC device 236 is attached to the patch panel 201 locally to the adapter 203. In alternative embodiments, the functionality of the adapter IC device 236 may be located away from the locality of the adapter 203. For example, at least some functionality of the IC device 236 can be located at the controller 206. In some embodiments, the adapter 203 provides a direct internal communication connection 510 between the controller 206 and an external connector connected to the adapter 205, no power connection 511 being necessary. In some embodiments, the IC device 236 includes an RFID transponder for communicating with an RFID reader connected to the controller internal communication using, for example LLRP (Low Level Reader Protocol), no hardwired internal communication connection 510 being necessary, and/or the adapter IC device 236 may be operable to automatically communicate with an IC device of a connector 253, 283 to exchange data with the connector 253, 283 IC device in response to connection of the connector 253, 283 in a port 230 of the adapter 203. In some embodiments, RFID transponders respectively associated with a connector and port are adapted to communicate with one another to allow information from each of the transponders to be communicated to an RFID reader associated with the port and/or patch panel controller via communication with only one transponder, as disclosed for example in U.S. 2008/0100456A1, incorporated herein by reference in its entirety.

In some embodiments, the cable end connector 253 IC device 305 includes an RFID transponder for communicating with an RFID reader connected to the controller internal communication interface 410 using, for example LLRP (Low Level Reader Protocol), and/or the connector IC device 305 may be operable to automatically communicate with the IC device 236 of the adapter 203 to pass the cable data 630 to the adapter IC device 236 in response to connection of the connector 253 in a port 230 of the adapter 203.

Figure 8:
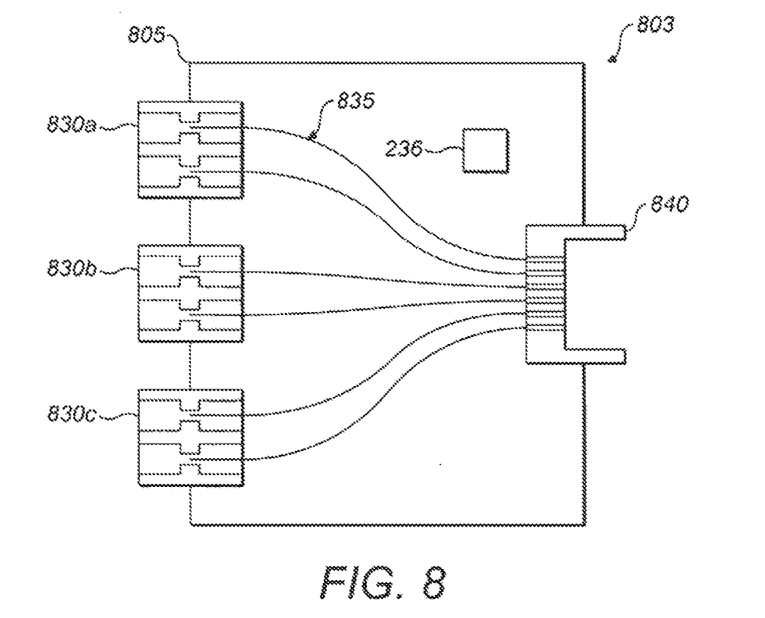
FIG. 8 is a partial cross sectional view showing selected elements of an alternative adapter of the multi-adapter apparatus of FIG. 2, for breaking out a multifiber connector.

FIG. 8 shows an alternative adapter 803 that can be used with the patch panel 201. The alternative adapter 803 comprises a body 805 supporting multiple ports 830*a*, 830*b*, 830*c* to receive multiple respective network cable end connectors 253. An opposite port 840 is adapted to receive a multi strand, or multifiber, cable such as an MTP cable. Short fiber connections, shown generally as 835, are provided for interconnecting fibers at the first ports 830*a*, 830*b*, 830*c* with fibers at the second port 840. This breakout box adapter 803 is provided with an adapter IC device 236, modified to enable connections 511*a*, 510*a* to each of the ports 830*a*, 830*b*, 830*c*.

Figure 9:
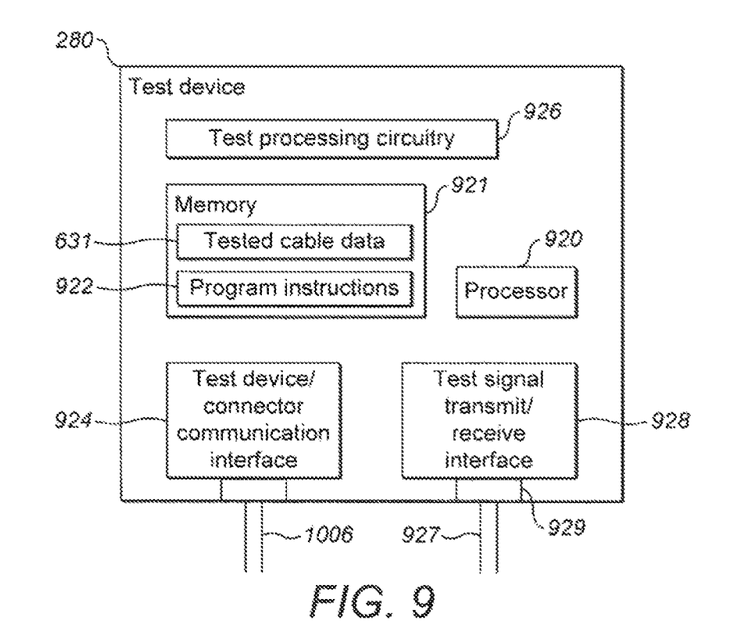
FIG. 9 is a schematic diagram illustrating selected functional elements of a test device connectable to the adapters of FIGS. 5 and 8.
Figure 10:
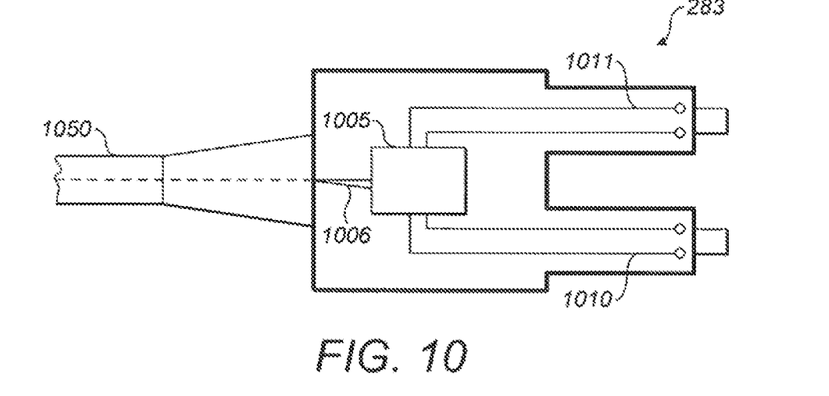
FIG. 10 is a cross sectional view showing selected elements of a connector to connect the test device of FIG. 9 to an adapter of the multi-adapter apparatus of FIG. 2.

FIG. 9 shows a cable test device 280 that can take the form, for example, of an optical time domain reflectometer (OTDR). The test device 280 is coupled to a cable 1050 having a cable end connector 283 shown in greater detail in FIG. 10. The cable end connector 283 comprises a modified LC connector, and in alternative embodiments can take the form of any convenient and appropriate type of connector. The connector 283 includes an integrated circuit (IC) device 1005, shown in greater detail in FIG. 11. The connector 283 provides an electrical connection 1010 configured to mate with the corresponding electrical connection 510*a* of the adapter 203 when the connector 283 is inserted in the port 230, to enable inter-integrated circuit communication between the IC device 1005 and the adapter IC device 236. The connector 283 may also provide an electrical connection 1011 configured to mate with the corresponding electrical connection 511*a* of the adapter 203 when the connector 283 is inserted in the port 230, to enable the IC device 1005 to receive power from the controller 206. In alternative embodiments, the power connection 1011 can be omitted, and an electrical connection can be provided from a power supply (not shown) of the test device 280 along cable 1050 to the IC device 1005.

The test device 280 comprises a processor 920 and a memory 921. The memory 921 can take the form, for example, of at least one selected from EEPROM, flash memory, RAM or any other convenient type of memory. The memory 921 stores program instructions 922 executable by the processor 920 to provide various functions of the test device 280. The test device implements a communication interface 924 to communicate with a communication interface 1124 of the IC device 1005 of the connector 283, for example using an inter-integrated circuit communication protocol such as I2C or any convenient alternative protocol, through electrical wiring 1006 which may be provided within the cable 1050. The test device 280 also implements a test signal transmit/receive interface 928 that controls transmit and receive apparatus 929. In one embodiment, the transmit and receive apparatus 929 comprises an optoelectronic transmitter to send optical test signals through optical cabling 927 of the cable 1050, through the connector 283 into a cable connected to an opposite side of an adapter. The transmit and receive apparatus 929 further comprises an detector to detect reflected energy from the cable and provide electrical output.

Figure 12:
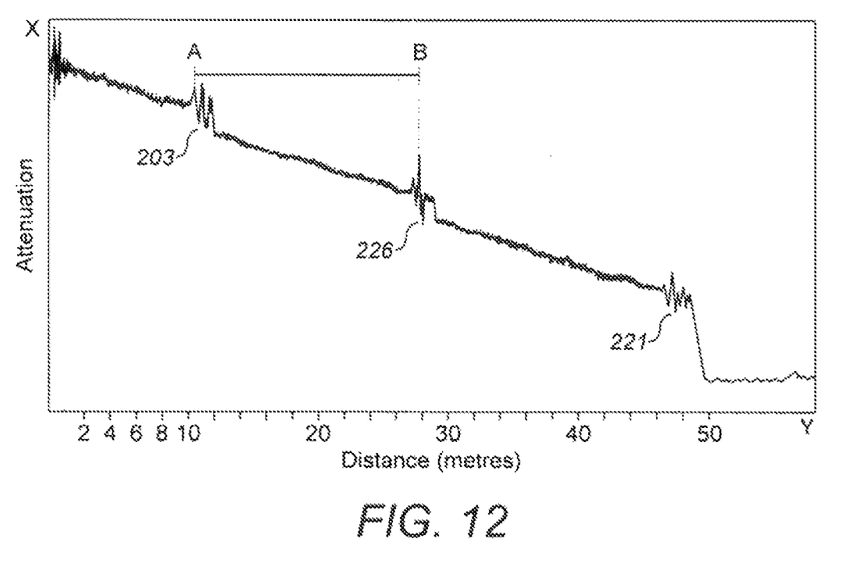
FIG. 12 illustrates typical test results showing a relationship between attenuation (axis X) in decibels of an optical signal along an optical fiber and distance from the test device 280 (axis Y) in meters.

The test device 280 implements processing circuitry 926 to process in a known manner the data thus provided, to provide a measure of the relationship between optical signal attenuation and distance from the test device 280, along the cabling 250, 251, 252 between the test device 280 and the storage 221. By way of illustration, a typical relationship between attenuation (axis X) in decibels and distance from the test device 280 (axis Y) in meters is shown in FIG. 12. It can be seen that the length of various cables along the route from the test device to the storage 221 can be inferred from the attenuation characteristic. The test device 280 is pre-programmed, in accordance with the program instructions 922, to determine the distance AB between an attenuation drop indicating the adapter 203 to which the OTDR connector 283 connects, and an attenuation drop indicating next connection, in the present embodiment located at adapter 226, thus providing an inferred length for the cable 251 connected to the port 240 of adapter 203. Data 631, for example an inferred length for cable 251 in meters, resulting from the processing of the reflected signal attenuation data by the test device 280, is stored by the test device in memory 921.

Figure 11:
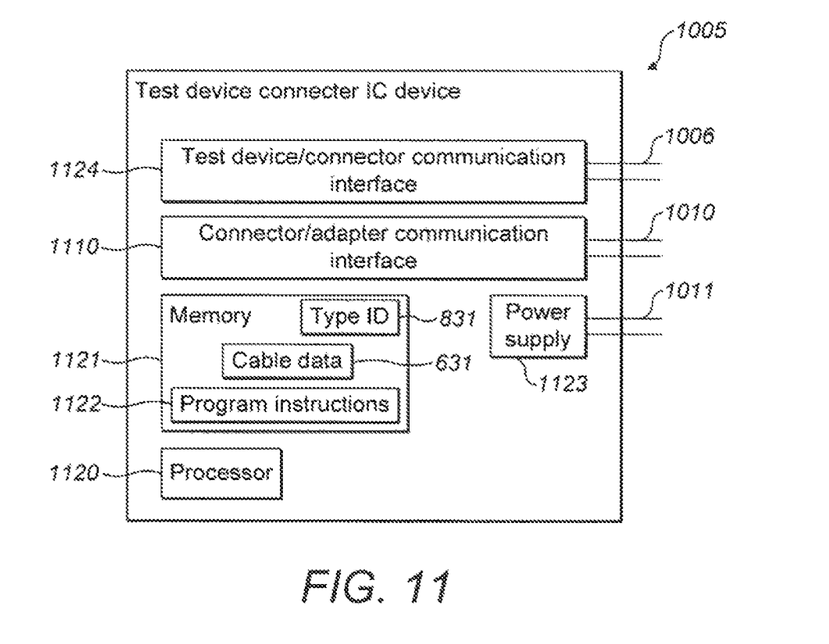
FIG. 11 is a schematic diagram illustrating selected functional elements of an integrated circuit (IC) device associated with the connector of FIG. 10.

The test device connector IC device 1005 comprises a processor 1120 and a memory 1121. The memory 1121 can take the form, for example of EEPROM, flash memory or any other convenient type of memory. The memory 1121 stores program instructions 1122 executable by the processor 1120 to provide various functions of the IC device 1005. The IC device 1005 implements, in addition to the test device communication interface 1124, a connector/adapter communication interface 1110 for inter-integrated circuit communication with the adapter IC device 236 through the electrical connection 1110. The IC device 1005 also comprises a power supply 1123 for receiving power through the adapter 203 through mating electrical connections 1011 and 511*a* when the connector 283 is connected to the port 230 of the adapter 203. Alternatively, the power supply 1123 can receive power by other means, for example from the test device 280, or from an RFID parasitic supply or battery. The resulting data 631 stored in the test device memory 921 is communicated to the IC device 1005 using the connector to adapter communication interfaces 1110, 650. The IC device 1005 is adapted to store the resulting tested-cable data in an appropriate location in the memory 1121 according to a suitable protocol accommodating such tested cable data, for example according to an extended SFF-8472 or any other convenient protocol.

While various embodiments are described herein with respect to optical fiber cable technology, at least some embodiments can also be employed using other cable technology such as electrical communications cable technology. For example, while the cable 250 is a multimode fiber optic cable having two optical fibers, and the cable end connector 253 is shown as a modified LC connector 253, in alternative embodiments the cable 250 comprises another type of fiber optic cable, for example a single mode, single fiber, cable, or an electrical communication cable, for example comprising a copper signal conductor, and the connector 253 can comprise any other convenient and appropriate type of cable end connector. The test device 280 can take the form of an electrical time domain reflectometer (TDR), as appropriate for the main transmission cable type, and the corresponding connector 283 can comprise any convenient and appropriate type of connector. It will be apparent that the high-frequency main transmission channels, for example the optical fiber channels in embodiments using optoelectronic technology, are omitted from the figures.

Figure 13:
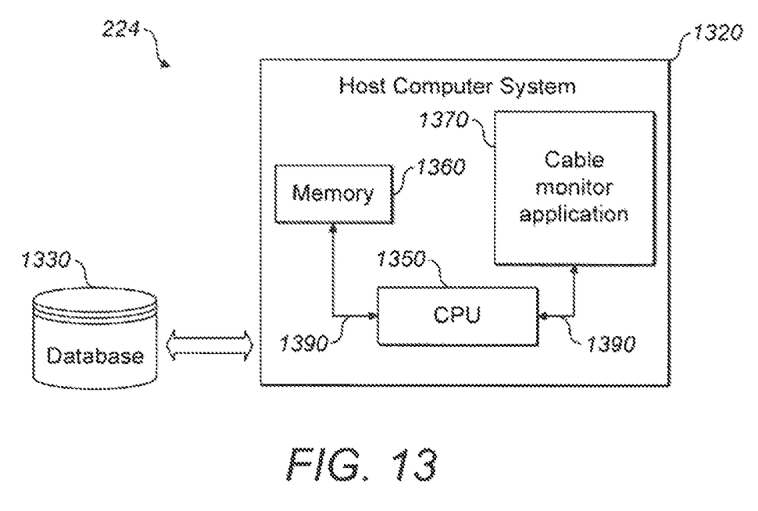
FIG. 13 is a schematic diagram illustrating selected functional elements of a host computer system to execute a cable monitoring application.

FIG. 13 illustrates an exemplary system 1300 for physical layer monitoring of a cable system during use. The system 1300 includes a host computer system 224 and a repository, warehouse, or database 1330. The host computer system 224 comprises a processing unit 1350 (such as one or more processors or central processing units, CPUs) for controlling the overall operation of memory 1360 (such as random access memory (RAM) for temporary data storage and read only memory (ROM) for permanent data storage) and a cable monitor and diagnostic algorithm 1370 for monitoring in real-time optical fiber cables during operation or use of the cables. The algorithm provides an estimation of the overall operational status of one or more specific cables. By way of illustration, such operation status includes good/normal, degraded, and/or failed.

The memory 1360 stores data, control programs, and other data associated with the host computer system 224. In some embodiments, the memory 1360 stores the cable monitoring and diagnostic algorithm 1370. The processing unit 1350 communicates with memory 1360, database 1330, cable monitoring and diagnostic algorithm 1370, and many other components via buses 1390.

Embodiments in accordance with the present invention are not limited to any particular type or number of databases and/or host computer systems. In some embodiments the host computer system 224 can include, for example, various portable and non-portable computers and/or electronic devices. Exemplary host computer systems include, but are not limited to, computers (portable and non-portable), servers, main frame computers, distributed computing devices, laptops, and other electronic devices and systems whether such devices and systems are portable or non-portable.

In a method according to one embodiment of the invention, a connector 283 of an OTDR device 280 is connected to first port 230 of adapter 203 (step 1410, FIG. 14) of the patch panel 201, similarly to the test device 280 connection shown in FIG. 2 to adapter 205. The OTDR device 280 is activated, and obtains and processes reflected signal attenuation data from the cable 251 connected to a second port 240 of the adapter 203 (step 1420, FIG. 14). In a third step (step 1430, FIG. 14), data 631 resulting from the processed signal attenuation data is stored in memory associated with the patch panel 201. For example, in one embodiment the resulting data 631 may be an inferred length of cable 251, and the data 631 is automatically communicated from the test device 280 to the test device connector IC device 1005 using the communication interfaces 924, 1124, and from the test device connector IC device 1005 to the adapter IC device 236 using the communication interfaces 1110, 650, and stored by the adapter IC device 236 in the memory 621 of the adapter IC device 236. The adapter IC device 236 stores the data 631 as tested-cable data, in response to receiving the connector type identification data 831 from the test device connector IC device 1005.

Figure 14:
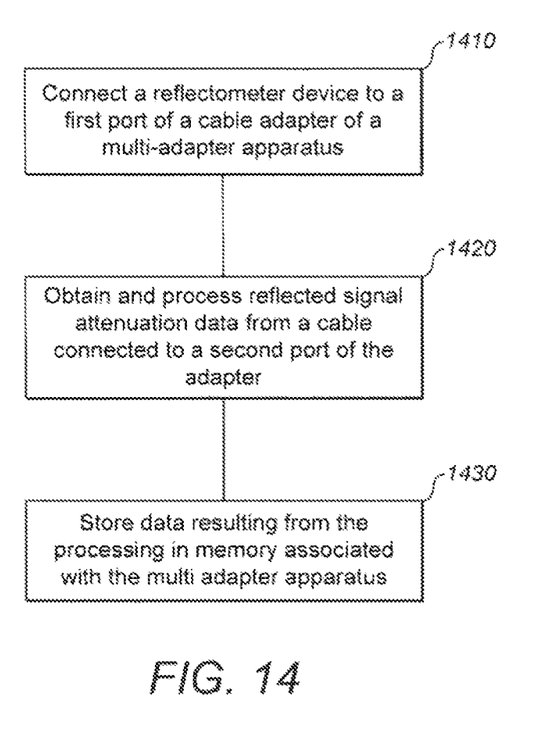
FIG. 14 is a flow diagram showing steps from an exemplary method of storing data resulting from processing data from a reflected signal.

The OTDR device connector 283 can then be removed from the port 230, and the OTDR device deployed with another port or in another location. A cable end connector 253 of a networked cable 250 can then be inserted in the port 230. Cable data 630 relating to the networked cable 250 is automatically communicated from the network cable end connector IC device 305 to the adapter IC device 236 using the interfaces 310, 650. The adapter IC device 236 stores the data 630 as network cable data, in response to receiving the connector type identification data 731 from the network cable and connector IC device 305. The network cable data 630 and the tested cable data 631 are accessed by the controller 206 through the communication interfaces 410, 510 and stored in the controller memory 421. For example, the controller 206 may poll the adapter IC device 206 at regular intervals for the data 630, 631. Alternatively, the receipt of new network cable data 630 and/or new tested-cable data 631 by the adapter IC device 236 may trigger an event to cause the controller 206 to automatically access the data 630, 631 stored on the adapter IC device 236. In alternative embodiments, at least some functionality of the adapter IC device 236 may be provided on the controller 206, and/or at least some functionality of the test device connector IC device 1005 may be provided on the test device 280, and the controller 206 may communicate directly with the test device 280 or the test device connector IC device 1005 to obtain the data 630, 631.

At least some of the embodiments described above facilitate dynamic monitoring by a cable physical layer monitoring application of a cable connection, to one side of a patch panel, having low level (low power, low frequency, relative to the main cable transmission signal) cable to patch panel controller communication, and also monitoring of more static data from a cable connection, to an opposite side of the patch panel, not equipped with cable to patch panel controller communication. Particularly when used in a network at both ends of cables not having cable to patch panel controller communication, various embodiments described above can facilitate better overall dynamic physical layer monitoring of a network cable infrastructure including patch panels.

As used herein, the term storage means any data storage device capable of storing data including, but not limited to, one or more of a disk array, a disk drive, a tape drive, optical drive, a SCSI device, or a fiber channel device. Further, as used herein an SFP or small form-factor pluggable is an optical transceiver used in optical communications for telecommunication and/or data communications. SFPs interface network devices to fiber optic cable.

In one exemplary embodiment, one or more steps discussed herein are automated, in other words, occur automatically. As used herein, the terms "automated" or "automatically" (and like variations thereof) mean controlled operation of an apparatus, system and/or process using computers and/or mechanical/electrical devices without the necessity of human intervention, observation, effort and/or decision.

The methods in accordance with exemplary embodiments of the present invention are provided as examples and should not be construed to limit other embodiments within the scope of the invention. For instance, blocks in diagrams or numbers (such as (1), (2), etc.) should not be construed as steps that must proceed in a particular order. Additional blocks/steps may be added, some blocks/steps removed, or the order of the blocks/steps altered and still be within the scope of the invention. Further, specific numerical data values (such as specific quantities, numbers, categories, etc.) or other specific information should be interpreted as illustrative for discussing exemplary embodiments. Such specific information is not provided to limit the invention.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. Cable adapter apparatus comprising at least one adapter and a controller, the adapter apparatus being operable to:
   determine connection of a cable test device to a first port of the at least one adapter;
   receive data from the test device relating to at least one tested characteristic of a cable connected to a second port of the at least one adapter opposite said first port;
   receive data relating to the cable stored in a cable end connector;
   store both the data from the test device relating to the at least one tested characteristic and the data relating to the cable in a memory in the controller of the adapter; and
   make the data stored in the memory available to a cable monitor application.

2. The cable adapter apparatus of claim 1, wherein the cable test device comprises a time domain reflectometer (TDR) or an optical time domain reflectometer (OTDR).

3. The cable adapter apparatus of claim 1, wherein the tested characteristic includes a length of cabling connected to the second port.

4. The cable adapter apparatus of claim 1, further operable to:
   determine a connected condition of an end connector of a network communication cable to the first port of the at least one adapter;
   receive from time to time, from the network communication cable end connector, network communication cable data relating to the cable connected to the first port;
   store the received network communication cable data in the memory; and
   make the received network communication cable data stored in the memory available to the cable monitor application.

5. The cable adapter apparatus of claim 1, wherein the cable adapter apparatus comprises a multi-adapter apparatus, the controller comprising memory to store received network communication cable data and the data from the test device relating to at least one tested characteristic for the respective first and second ports of each respective adapter.

6. The cable adapter apparatus of claim 1, further comprising at least one first integrated circuit (IC) device respectively associated with the at least one adapter, the at least one first IC device being operable to:
   communicate with a second integrated circuit (IC) device associated with a connector connected to the first port, to identify the present connection type at the first port as a cable test device connection or a network communication cable connection;
   store data received from the present connection to the memory in the controller in accordance with the connection type identification; and
   make the data available to the controller.

7. The cable adapter apparatus of claim 6, wherein the at least one first IC device is operable to store the data received from the present connection to the memory of the first IC device.

8. The cable adapter apparatus of claim 1, wherein the controller comprises a processor, and stored program instructions executable by the processor to cause the controller to communicate the data from the test device relating to the at least one tested characteristic and network communication cable data to the cable monitor application using a network protocol.

9. The cable adapter apparatus of claim 1, wherein the cable adapter apparatus comprises a data center patch panel with a power supply for supplying power to the at least one adapter.

10. A method comprising:
    detecting connection of a time domain reflectometer (TDR) device or an optical time domain reflectometer (OTDR) device to a first port of a cable adapter of a multi-adapter apparatus;
    receive data relating to the cable stored in a cable end connector;
    obtaining and processing reflected signal attenuation data from a cable connected to a second port of the adapter; and
    storing both data resulting from the processing and the data relating to the cable in memory in a controller associated with the multi-adapter apparatus.

11. The method of claim 10, further comprising storing the respective resulting data from a plurality of adapters in local memories associated with the respective adapters.

12. The method of claim 10, wherein the resulting data comprises cable length data.

13. The method of claim 10, further comprising:
    detecting connection of an end connector of a network communication cable to the first port;
    receiving from time to time from the network communication cable end connector data relating to at least one characteristic of a cable presently connected to the first port;
    storing the received network communication cable data in the memory; and
    making the data resulting from the TOR or OTDR processing and the stored network communication cable data available over a network to a cable monitor application.

14. A time domain reflectometer (TDR) or optical time domain reflectometer (OTDR) device adapted to be connected to a first port of a cable adapter, obtain and process reflected signal attenuation data from a cable connected to a second port of the adapter, receive data relating to the cable stored in a cable end connector, provide device type identification data to enable the adapter to determine connection of a cable test device to the first port, store both the data from processing the reflected signal attenuation data and the data relating to the cable in a memory in a controller of the cable adapter, and output data resulting from the processing for storage in accordance with the determined device type in a memory associated with the adapter.

15. The TOR or OTDR device of claim 14, further comprising a coupling to couple the TDR or OTDR device to a cable end connector for connecting the TDR or OTDR device to the first port of the cable adapter, the connector comprising a first integrated circuit (IC) device operable to communicate with a second integrated circuit (IC) device associated with the adapter, the first IC device comprising a memory identifying the connector to the second IC circuit as a TDR or OTDR connector.

16. The cable adapter apparatus of claim 1, wherein the at least one adapter includes an end connector connected to a port of a switch, and further comprising a cable interconnecting a rear port of a patch panel adapter with a port of a further adapter.

17. The cable adapter apparatus of claim 1, further comprising an integrated circuit mounted in the at least one adapter.

18. The cable adapter apparatus of claim 17, wherein the at least one adapter includes a processor and a memory storing program instructions executable by the processor.

19. The cable adapter apparatus of claim 1, further comprising a first adapter connected to a second adapter, connected to a third adapter.

20. The cable adapter apparatus of claim 19, wherein the first and second adapters are connected directly to a switch, and the third adapter is connected to the switch via the first adapter.

\* \* \* \* \*